(12) United States Patent
Kim et al.

(10) Patent No.: US 7,847,583 B2
(45) Date of Patent: *Dec. 7, 2010

(54) TRANSMITTER AND RECEIVER USING ASYMMETRIC TRANSFER CHARACTERISTICS IN DIFFERENTIAL AMPLIFIERS TO SUPPRESS NOISE

(75) Inventors: Gyudong Kim, San Jose, CA (US); Min-Kyu Kim, Cupertino, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 12/275,686

(22) Filed: Nov. 21, 2008

(65) Prior Publication Data

US 2009/0137208 A1 May 28, 2009

Related U.S. Application Data

(60) Division of application No. 11/330,047, filed on Jan. 10, 2006, now Pat. No. 7,456,648, which is a continuation of application No. 09/989,487, filed on Nov. 20, 2001, now Pat. No. 6,985,005.

(51) Int. Cl.
*H03K 17/16* (2006.01)

(52) U.S. Cl. .......................................... 326/26; 326/82

(58) Field of Classification Search ............. 326/21–27, 326/82–90
See application file for complete search history.

(56) References Cited

U.S. PATENT DOCUMENTS 6,452,428 B1 * 9/2002 Mooney et al. ............. 327/108
6,600,339 B2 * 7/2003 Forbes et al. ................. 326/86

* cited by examiner

*Primary Examiner*—Don P Le
(74) *Attorney, Agent, or Firm*—Perkins Coie LLP

(57) ABSTRACT

An output amplifier is provided for use in a bidirectional communications interface, for example, connecting a transmitter and a receiver to a transmission line. The output amplifier includes a differential amplifier pair connected to output circuitry. The differential amplifier pair receives differential data signal pairs from each of a transmission line and a transmitter. The output circuitry receives signals from the differential amplifier pair and, in response, forms single-ended output logic signals. The output amplifier suppresses electronic input noise throughput using an asymmetric transfer characteristic that offsets output signal logic levels with respect to input noise signal levels. The asymmetric transfer characteristic is produced by skewing a transfer characteristic of the differential amplifier pair using an asymmetrical transistor configuration at an output side of the differential amplifier pair. The output logic signals represent data received on the transmission line, and are provided to the receiver.

18 Claims, 14 Drawing Sheets

TRANSMITTER AND RECEIVER USING ASYMMETRIC TRANSFER CHARACTERISTICS IN DIFFERENTIAL AMPLIFIERS TO SUPPRESS NOISE

CROSS-REFERENCE TO RELATED APPLICATIONS

This application is a divisional application and claims the benefit of priority of U.S. patent application Ser. No. 11/330, 047, filed Jan. 10, 2006, entitled "Differential Amplifiers Using Asymmetric Transfer Characteristics to Suppress Input Noise In Output Logic Signals" issued as U.S. Pat. No. 7,456, 648, on Nov. 25, 2008, which is a continuation application and claims the benefit of priority of U.S. patent application Ser. No. 09/989,487 filed Nov. 20, 2001, entitled "Differential Amplifiers Using Asymmetric Transfer Characteristics to Suppress Input Noise In Output Logic Signals" issued as U.S. Pat. No. 6,985,005, on Jan. 10, 2006, all of which are hereby incorporated by this reference.

TECHNICAL FIELD

The disclosed embodiments relate to differential amplifiers used in high-speed serial communication links.

BACKGROUND

There are a variety of systems for transmitting data between a transmitter and a receiver. Most systems provide a return communications channel by which signals are sent from the receiver back to the transmitter only by using additional signal lines. This is especially true for high-speed digital communication links. However, the additional signal line and its associated interface add significant complication to the communications link.

Other systems provide a return communications channel by adding a second transmitter and a second receiver connected with a second signal line. However, this approach essentially doubles the hardware requirements making such a solution expensive and sometimes even impractical. Furthermore, such duplication becomes a large overhead in the case of an asymmetric communications link, for example, when the bandwidth of the return channel is smaller than that of forward channel.

U.S. Pat. No. 5,675,584 (the "'584 patent"), entitled "High Speed Serial Link for Fully Duplexed Communication," describes a system for concurrently providing outgoing serial data to, and receiving incoming serial data from, a transmission line using a bidirectional buffer. The disclosed bidirectional buffer receives a mixed data signal on the transmission line. The mixed data signal is a superposition of the outgoing serial data signal and the incoming serial data signal. The incoming serial data signal is extracted from the mixed data signal on the transmission line by subtracting the outgoing serial data signal from the mixed data signal.

The typical bidirectional buffer or bridge circuit includes a differential amplifier which amplifies the difference between the outgoing serial data signal and the mixed data signal on the transmission line. Thus, one input, e.g., the positive input $v_p$, of the differential amplifier is $v_{out}+v_{in}$, where $v_{out}$ is the voltage proportional to the output serial data signal, and $v_{in}$ is the voltage proportional to input serial data signal. The second input, e.g., the negative input $v_n$, of the differential amplifier, is $v_{out}$. The input sensitivity of a bidirectional bridge circuit is limited by the common mode rejection of the differential amplifier. The outgoing data signal is a common mode signal to the differential amplifier. The common mode signal for the differential amplifier can be expressed as follows:

$$v_c=(v_p+v_n)/2=(2v_{out}+v_{in})/2=v_{out}+v_{in}/2$$

where $v_c$, is the common mode input voltage; $v_p$, is the positive input voltage; $v_n$ is the negative input voltage; $v_{out}$ is the voltage proportional to the output serial data signal; and $v_{in}$ is the voltage proportional to input serial data signal.

If the voltage proportional to the input serial data signal, $v_{in}$, is relatively small and the differential amplifier is not ideal, the common mode input of the differential amplifier can control the output of the differential amplifier and the bidirectional bridge circuit can produce an output signal proportional only to the outgoing serial data signal.

The voltage that is proportional to the input data signal can be small when transmission over the transmission line attenuates the incoming serial data signal. This attenuation provides a guideline for common mode and differential gain of the differential amplifier. The common mode rejection ratio of the differential amplifier should be larger than the attenuation by the transmission line. This guideline is expressed as follows:

$$A_c \cdot (v_{out}+v_{in}/2) < A_d \cdot v_{in} = A_d \cdot \Gamma \cdot v_{out}$$

where $A_c$ is the common mode gain of the differential amplifier: $A_d$ is the differential gain of the differential amplifier; and $$\Gamma = \frac{v_{in}}{v_{out}}$$

is the attenuation coefficient of the transmission line. Therefore, meeting the condition $$A_d/A_c > \left(\Gamma^{-1}+\frac{1}{2}\right)$$

provides improved operation of a bidirectional link.

Furthermore, the difference in the loading condition between the two input nodes of the differential amplifier affects the performance of the bridge circuit differential amplifier. This asymmetry comes from the fact that one of the input nodes of the differential amplifiers couples to the pad and transmission line while the other input node does not. The extra loading due to the protection device against electrostatic discharge and parasitic devices associated with the pad can have an adverse effect on the switching transients of the differential amplifier.

BRIEF DESCRIPTION OF THE DRAWINGS

In the figures, the same reference numbers identify identical or substantially similar elements or acts. Figure numbers followed by the letters "A," "B," etc. indicate that two or more figures represent alternative embodiments or methods under aspects of the invention.

As is conventional in the field of electrical circuit representation, sizes of electrical components are not drawn to scale, and various components can be enlarged or reduced to improve drawing legibility. Component details have been abstracted in the figures to exclude details such as position of components and certain precise connections between such components when such details are unnecessary to the invention.

The headings provided herein are for convenience only and do not necessarily affect the scope or meaning of the claimed invention.

DETAILED DESCRIPTION

Embodiments of this invention relate to systems and methods for providing a bidirectional bridge circuit with high common mode rejection and improved Input sensitivity. As such, a bidirectional communications interface is provided that connects a transmitter and a receiver, or a transceiver, to a transmission line. The bidirectional interface generates positive and negative polarity data signals using two separate differential amplifiers that receive differential signal pairs from each side of a differential link to the transmission line and the transmitter. The bidirectional interface controls common mode rejection in each of the separate differential amplifiers using bias signals generated in response to an output common mode feedback voltage from each of the differential amplifiers.

An output amplifier combines the positive and negative polarity data signals to form single-ended output logic signals. The output logic signals represent data received on the transmission line, and are provided to the receiver. The output amplifier suppresses the effects of input noise on the output logic signals using a skewed amplifier transfer characteristic curve. Further, the output amplifier includes an output NAND gate having a logic threshold voltage that is higher than a mid-supply voltage, thereby controlling symmetry in switching transients of the output logic signals.

The invention will now be described with respect to various embodiments. The following description provides specific details for a thorough understanding of, and enabling description for, these embodiments of the invention. However, one skilled in the art will understand that the invention may be practiced without these details. In other instances, well known structures and functions have not been shown or described in detail to avoid unnecessarily obscuring the description of the embodiments of the invention. For each embodiment, the same reference numbers and acronyms identify elements or acts with the same or similar functionality for ease of understanding and convenience.

Figure 1:
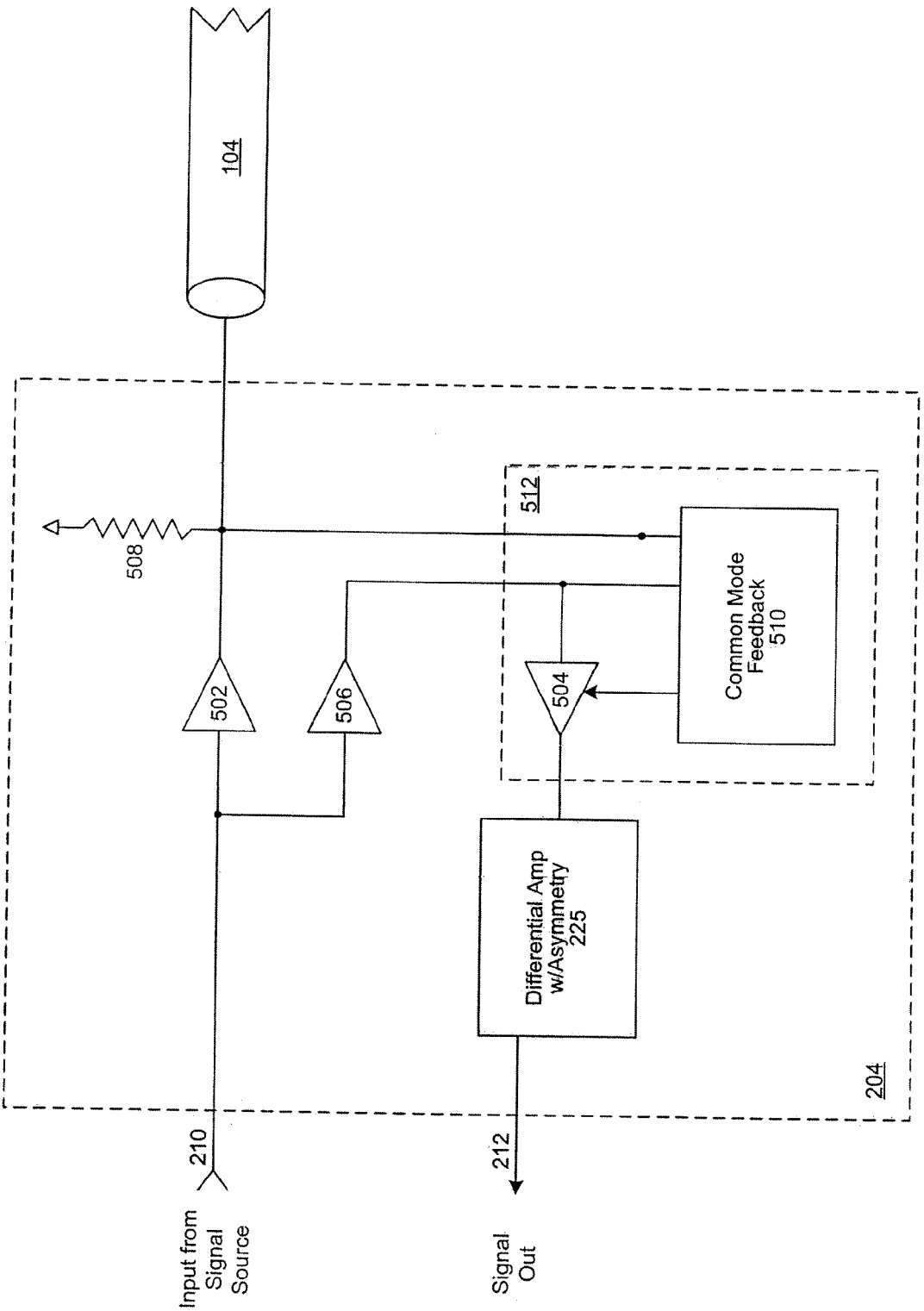
FIG. 1 is a block diagram of a bidirectional bridge circuit, under an embodiment.

FIG. 1 is a block diagram of a bidirectional bridge circuit 204, or bridge circuit, under an embodiment. This bidirectional bridge circuit 204 can be used in the front-end of numerous high-speed data communication systems, for example, data transceivers. The bidirectional bridge circuit 204 provides for transmission of data via a transmission line 104 while simultaneously receiving data from a receiver over the same transmission line 104. The bidirectional bridge circuit 204 functions by extracting incoming data on the transmission line 104 from the combined incoming/outgoing signal on the transmission line 104. This extraction is performed by subtracting the input 210 from a signal source, supplied in differential form, from the signal received via the transmission line 104. The transmission line signal is also supplied in differential form. The bidirectional bridge circuit 204 includes a first amplifier 502, a second amplifier 506, a differential amplifier with common mode feedback 512, and a differential amplifier with asymmetry 225, but is not so limited.

The bidirectional bridge circuit 204 receives inputs 210 from signal sources at the inputs of the first amplifier 502 and the second amplifier 506. The inputs 210 are in differential form and may be from any signal source, such as a transmitter. The outputs of the first amplifier 502 and the second amplifier 506 both connect to inputs of the differential amplifier with common mode feedback 512. A transmission line 104 also connects to the output of the first amplifier 502 and the input of the differential amplifier with common mode feedback 512. The output of the differential amplifier with common mode feedback 512 couples differential output signals to the differential amplifier with asymmetry 225. The differential amplifier with asymmetry 225 provides a single-ended output 212 that is representative of signals asserted by a receiver on the transmission line 104.

The differential amplifier with common mode feedback 512 includes a differential amplifier 504 and common mode feedback circuitry 510, as described below. The transmission line 104 and the output of the first amplifier 502 both couple to an input of the differential amplifier 504 and an input of the common mode feedback circuitry 510. The output of the second amplifier 506 couples to a second input of both the differential amplifier 504 and the common mode feedback circuitry 510. The common mode feedback circuit 510 provides feedback to the differential amplifier 504 to control the differential amplifier 504 to have a high common mode rejection ratio.

The bidirectional bridge circuit 204 further includes pull-up resistor 508 to couple the transmission line 104 to a high voltage source in order to form a line terminator. According to alternate embodiments of the line terminator, the pull-up resistor 508 can instead couple to ground or one-half of the supply or rail voltage, VDD, as will be understood by those skilled in the art. The components of the bidirectional bridge circuit 204 are now described in further detail.

Figure 2:
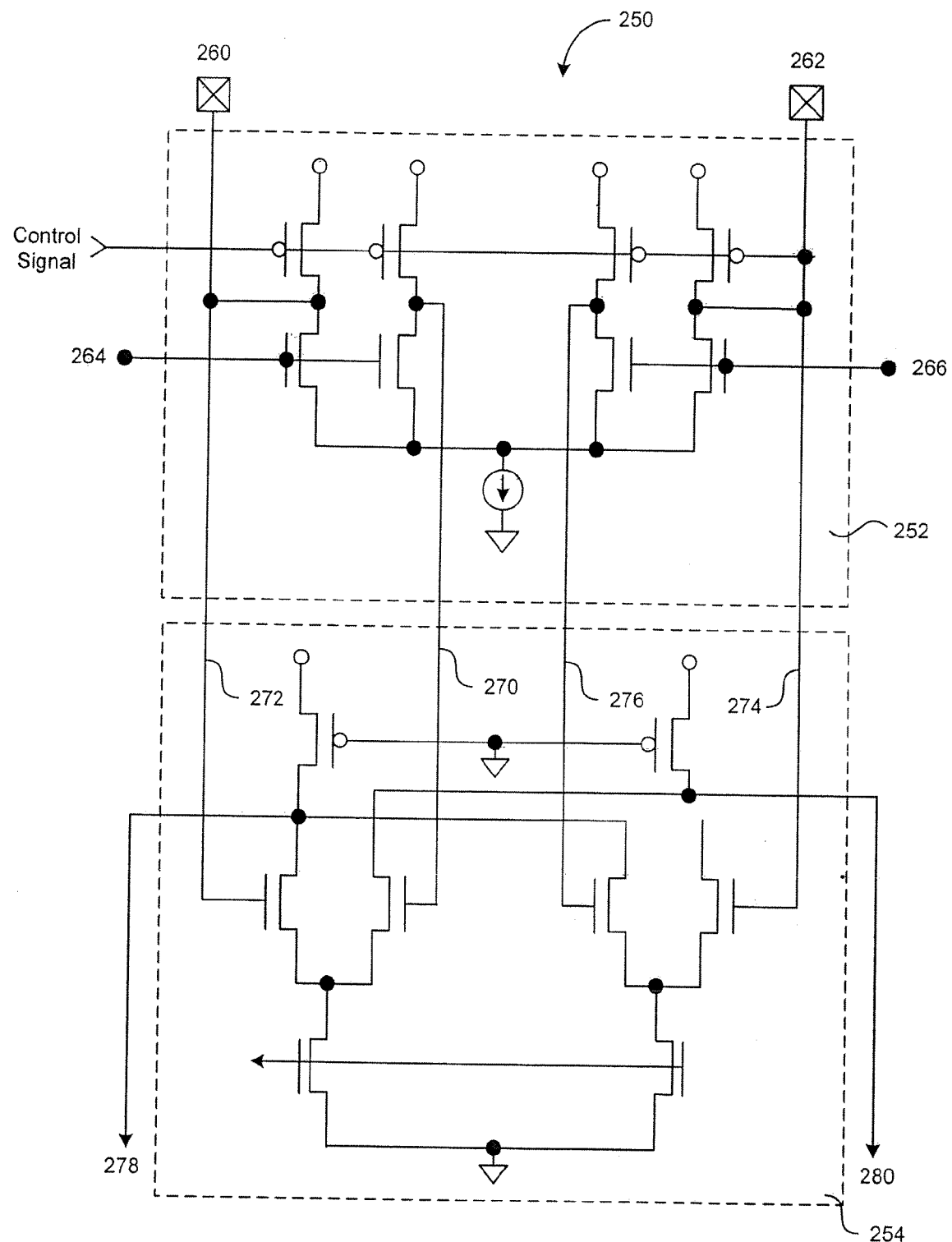
FIG. 2 is a prior art bidirectional bridge circuit.

FIG. 2 is a typical prior art bidirectional bridge circuit 250. This bridge circuit 250 includes front-end circuitry 252 that receives differential input signals 260 and 262 from a transmission line and differential inputs 264 and 266 from a signal source. The transmission line signals 260 and 262 include both incoming data signals from a distant transmitter and source signals from the local transmitter. The front-end circuitry 252 acts as a driver circuit for the outgoing signal on transmission line signals 260 and 262, and also generates a replica of outgoing signal 270 and 276 from differential inputs 264 and 266. Replica signals 270 and 276 are used as subtrahend signals by the subtracting differential amplifier 254.

The prior art bridge circuit 250 also includes a subtracting differential amplifier 254 that amplifies the difference of signals provided by the front-end circuitry 252. The prior art amplifier circuitry 254 includes a folded differential amplifier that receives four input signals 270, 272, 274, and 276 from the front-end circuitry 252. The amplifier circuitry 254 outputs differential signals 278 and 280 that are representative of the incoming data on the transmission line.

Figure 3:
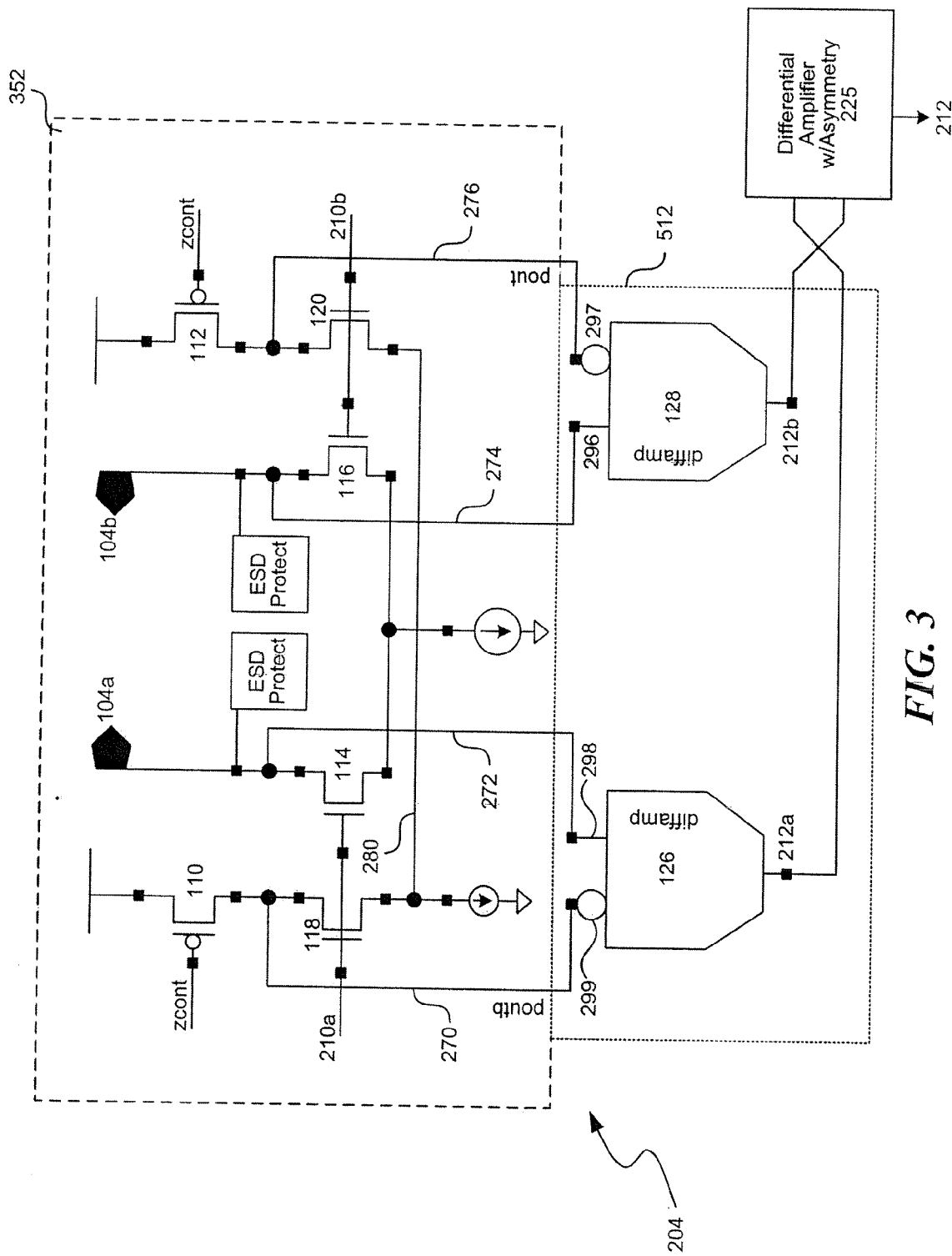
FIG. 3 is a circuit diagram for the bidirectional bridge circuit with high common mode rejection, under the embodiment of FIG. 1.

FIG. 3 is a circuit diagram for the bidirectional bridge circuit 204 with high common mode rejection under the embodiment of FIG. 1. The bidirectional bridge circuit 204 includes front-end circuitry 352 that receives differential inputs 104a and 104b from a transmission line and differential inputs 210a and 210b from a local signal source. As previously discussed, the local signal source can be a transmitter of a data transceiver device, but is not so limited. The front-end circuitry 352 is a driver circuit for the outgoing signal 104a and 104b, and also generates a replica of outgoing signal 104a and 104b from differential inputs 210a and 210b. Replica signals 297 and 299 are used as subtrahend signals by differential amplifiers 126 and 128. The front-end circuitry 352 is a differential representation of the amplifiers 502 and 506 of FIG. 1.

It is noted that the transmission line inputs 104a and 104b are differential signal pairs. The two signals of a differential signal pair represent opposite polarities of the associated signal. As such, for example, the input signal 104b of one of the pairs represents the positive polarity input signal from a remote transmitter added to the positive polarity output signal from the local signal source. Likewise, the input signal 104a of the other pair represents the negative polarity input signal from the remote transmitter added to the negative polarity output signal from the local signal source.

As with the transmission line inputs 104a and 104b, the local signal source inputs 210a and 210b are also differential signal pairs. Thus, for example, signal source input 210a is a negative polarity input signal from the local signal source, and signal source input 210b is a positive polarity input signal from the local signal source.

The bidirectional bridge circuit 204 also includes amplifier circuitry 512 that amplifies the difference signal coupled from the front-end circuitry 352. The amplifier circuitry 512 uses two separate differential amplifiers 126 and 128 for each side of the differential input signals to provide a high common mode rejection ratio, or high common mode rejection, and suppress feed-through of outgoing data into the received input signal. In one embodiment, the amplifier circuitry 512 receives the same four input signals 270, 272, 274, and 276 from the front-end circuitry 352, as in the prior art bridge circuit 250 of FIG. 2. However, instead of coupling the four input signals 270-276 to one differential amplifier, the amplifier circuitry 512 of an embodiment couples the four input signals 270-276 to the inputs of the two differential amplifiers 126 and 128.

The differential amplifiers 126 and 128 output differential signals 212a and 212b, respectively, that are representative of the received or incoming data on the transmission line. As with the transmission line inputs 104a and 104b and the signal source inputs 210a and 210b described above, the output signals 212a and 212b are also differential signal pairs. Thus, for example, output signal 212a is a positive polarity signal, and output signal 212b is a negative polarity signal. The output signals 212a and 212b are coupled to the differential amplifier with asymmetry 225, as further described below.

In describing the internal circuitry connections of bridge circuit 204, the source signal 210a couples to the gates of transistors 118 and 114. Transmission line 104a couples to the drain of transistor 114. The drain of transistor 118 couples via path 270 to a first input of differential amplifier 126 at node 299. The drain of transistor 114 couples via path 272 to the second input of differential amplifier 126 at node 298. Differential amplifier 126 produces differential output signal 212a.

Similarly, source signal 210b couples to the gate of transistors 116 and 120. Transmission line 104b couples to the drain of transistor 116. The drain of transistor 120 couples via signal path 276 to a first input of differential amplifier 128 at node 297. The drain of transistor 116 couples via path 274 to the second input of differential amplifier 128 at node 296. Differential amplifier 128 produces differential output signal 212b.

The use of separate differential amplifiers 126 and 128 for each of differential signals 104a and 104b, respectively, suppresses the feed-through of the outgoing data signal, or local source signal, into the recovered incoming data signal. As noted above, the voltage proportional to the input data signal can be small because the process of transmission attenuates the incoming serial data signal. This attenuation provides a guideline for common mode and differential gain of the differential amplifiers with common mode feedback 512. As noted above, the common mode rejection ratio of the differential amplifiers should be larger than the attenuation by the transmission line.

Figure 4:
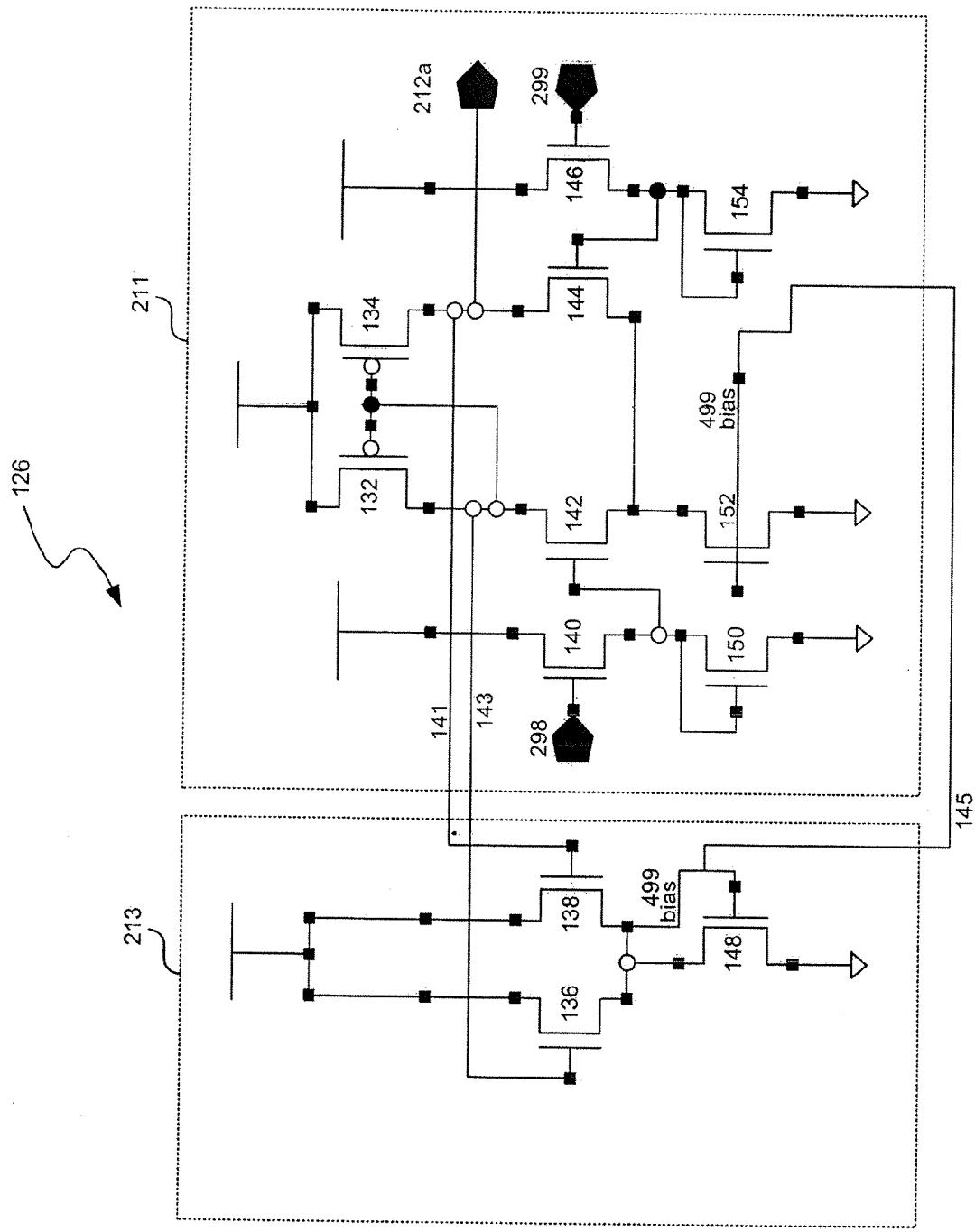
FIG. 4 is a circuit diagram of a differential amplifier that uses common mode feedback to provide high common mode rejection, under the embodiment of FIG. 3.

FIG. 4 is a circuit diagram of a differential amplifier 126 that uses common mode feedback to provide high common mode rejection under the embodiment of FIG. 3. The circuit diagrams of differential amplifiers 126 and 128 are the same, so for clarity the figures show, and the following discussion describes, only differential amplifier 126 and the associated couplings. However, it is understood that differential amplifier 128 functions in the same manner as differential amplifier 126, including being coupled to accept input signals and provide output signals in the same manner.

The differential amplifier 126 includes differential amplifier circuitry 211 and common mode feedback circuitry 213. With reference to FIG. 3, the signal path 272 couples the gate of transistor 140 of the differential circuitry 211 to the transmission line input 104a of the front-end circuitry 352 at node 298. Likewise, the signal path 270 couples the gate of transistor 146 of the differential circuitry 211 to the drain of transistor 118 of the front-end circuitry 352 at node 299. The source leads of transistors 140 and 146 couple to the gates of transistors 142 and 144, respectively. Transistors 140 and 146 are source followers that provide a direct current (DC) level shift at the input of the corresponding differential amplifiers. The drain of transistor 144 provides the output of the differential amplifier 126.

The differential amplifier 126 exhibits a high common mode rejection, at least in part, because of the bias voltage provided by the common mode feedback circuitry 213. Signal line 141 couples the drain of transistor 144 of the differential circuitry 211 to the gate of transistor 138 of the common mode feedback circuitry 213. Likewise, signal line 143 couples the drain of transistor 142 of the differential circuitry 211 to the gate of transistor 136 of the common mode feedback circuitry 213.

The common mode feedback circuitry 213 functions by producing a bias voltage 499 at the sources of transistors 136 and 138 as a result of the voltages applied to the gates of these transistors. The bias voltage 499 couples to the gate of transistor 152 in the differential amplifier circuitry 211 via signal path 145.

The drain of transistor 152 of the differential amplifier circuitry 211 couples back to the source node of transistors 142 and 144. As the bias voltage 499 controls the flow of current through transistor 152, an increase in bias voltage 499 resulting from an increase in common mode gain at the output of transistors 142 and 144 increases the current flow through transistor 152. An increase in current flow through transistor 152 consequently increases the current flow through transistors 142 and 144, and this reduces the common mode gain of this differential pair. The bias voltage 499, therefore, controls the bias of the differential pair formed by transistors 142 and 144 by using negative feedback to suppress the common mode gain.

The negative feedback is further explained using an example. Assume the common mode of the output 212a of the differential circuitry 211 increases, as exhibited by an increase in the voltage at the drains of transistors 142 and 144. This voltage increase is transferred to the gates of transistors 136 and 138 via signal paths 143 and 141, respectively. The voltage increase at the gates of transistors 136 and 138 results in an increase in current flow through transistors 136 and 138 and, therefore, an increase in the bias voltage 499. The increased bias voltage 499 applies an increased voltage to the gate of transistor 152 of the differential circuitry 211, resulting in an increase in the current flow through transistor 152. The increased current flows through transistors 136, 138, and 152 result in a voltage drop at the drains of transistors 142 and 144, thereby stabilizing the common mode of the differential circuitry 211. FIG. 4 is one embodiment of a differential amplifier with enhance common mode rejection, and does not restrict the scope of this invention only to this embodiment.

Common mode feedback as described above can also be used in the prior art bidirectional bridge circuit of FIG. 2 to provide high common mode rejection. In an alternative embodiment, the common mode feedback circuitry 213 described above with reference to FIG. 4 can be coupled to the prior art bidirectional bridge circuit to provide high common mode rejection.

Figure 5:
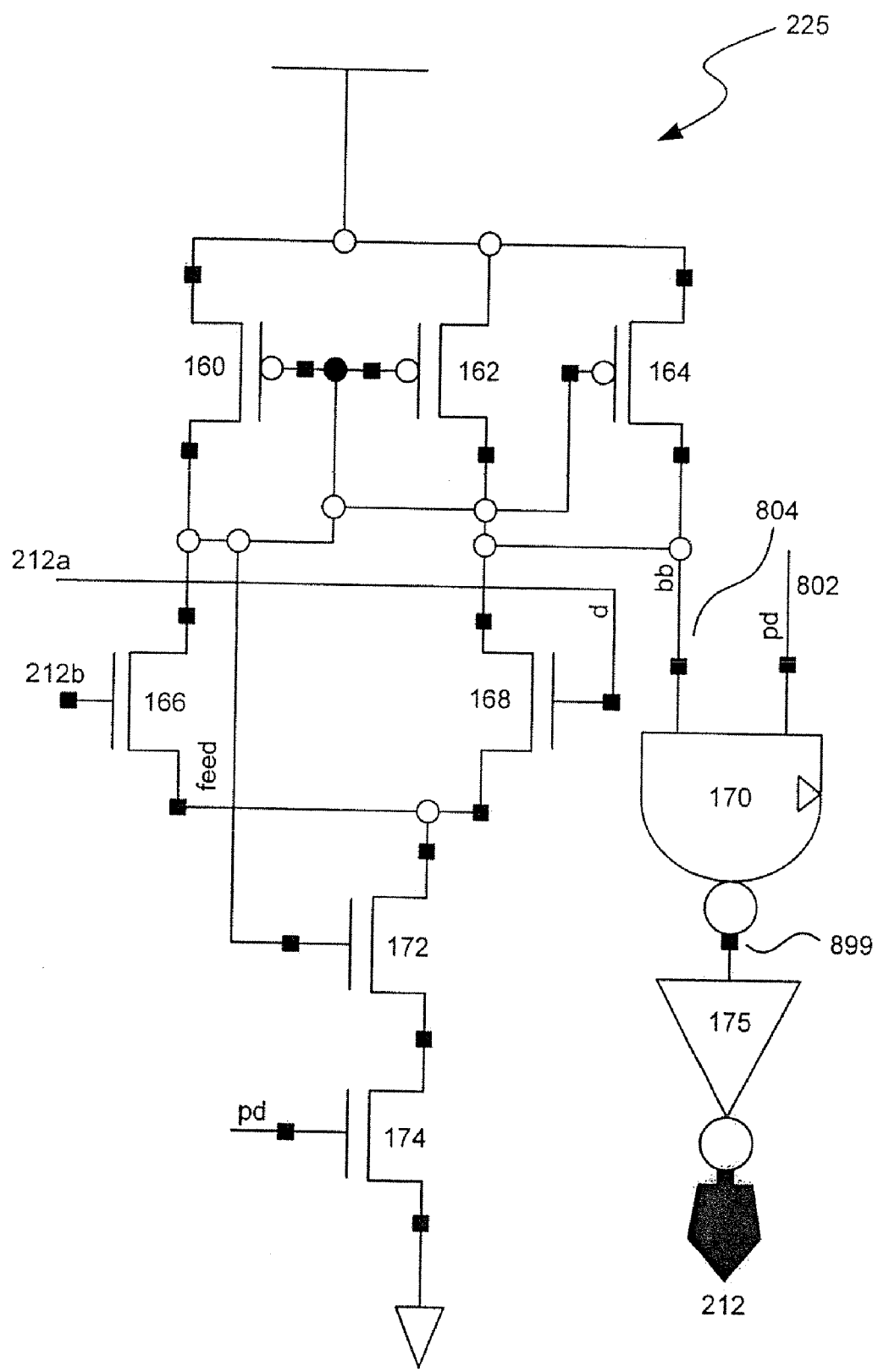
FIG. 5 is a circuit diagram of a differential amplifier with asymmetry to suppress noise, under the embodiment of FIG. 3.

The outputs 212a and 212b of the differential amplifiers 126 and 128 of the amplifier circuitry 512 form a differential signal pair, as described above. In order to provide a single-ended output 212 for interfacing with logic circuits, the embodiment of FIG. 3 includes the differential amplifier with asymmetry 225, which is shown in FIG. 5. In addition to providing a single ended output 212, the differential amplifier with asymmetry 225 further amplifies the signal pair output 212a and 212b of the differential amplifiers 126 and 128.

The differential amplifier with asymmetry 225 performs an additional function in desensitizing the bidirectional bridge circuit 204 to input noise by introducing asymmetry in the transfer characteristic of the amplifier 225, and thus the bidirectional bridge circuit 204. By providing asymmetry in the transfer characteristic of the amplifier 225, an offset is generated with regard to the input signal logic levels. This significantly reduces the chances of the bidirectional bridge circuit 204 interpreting input noise as data. This is best explained with reference to FIG. 6 which shows a plot of a transfer characteristic 612 of the bridge circuit 204 of the embodiment of FIG. 3.

Generally, in prior art differential signaling links, the absence of an input signal at the receiving side can result in an erroneous signal, i.e., the input buffer can amplify the input noise and present the amplified noise as a recovered incoming signal. This is especially problematic when a transmission line is decoupled or disconnected from the bidirectional bridge circuit, resulting in a "floating" input. The floating input easily couples to electronic noise in the environment, thereby introducing the noise to the coupled bidirectional bridge circuit.

Figure 6:
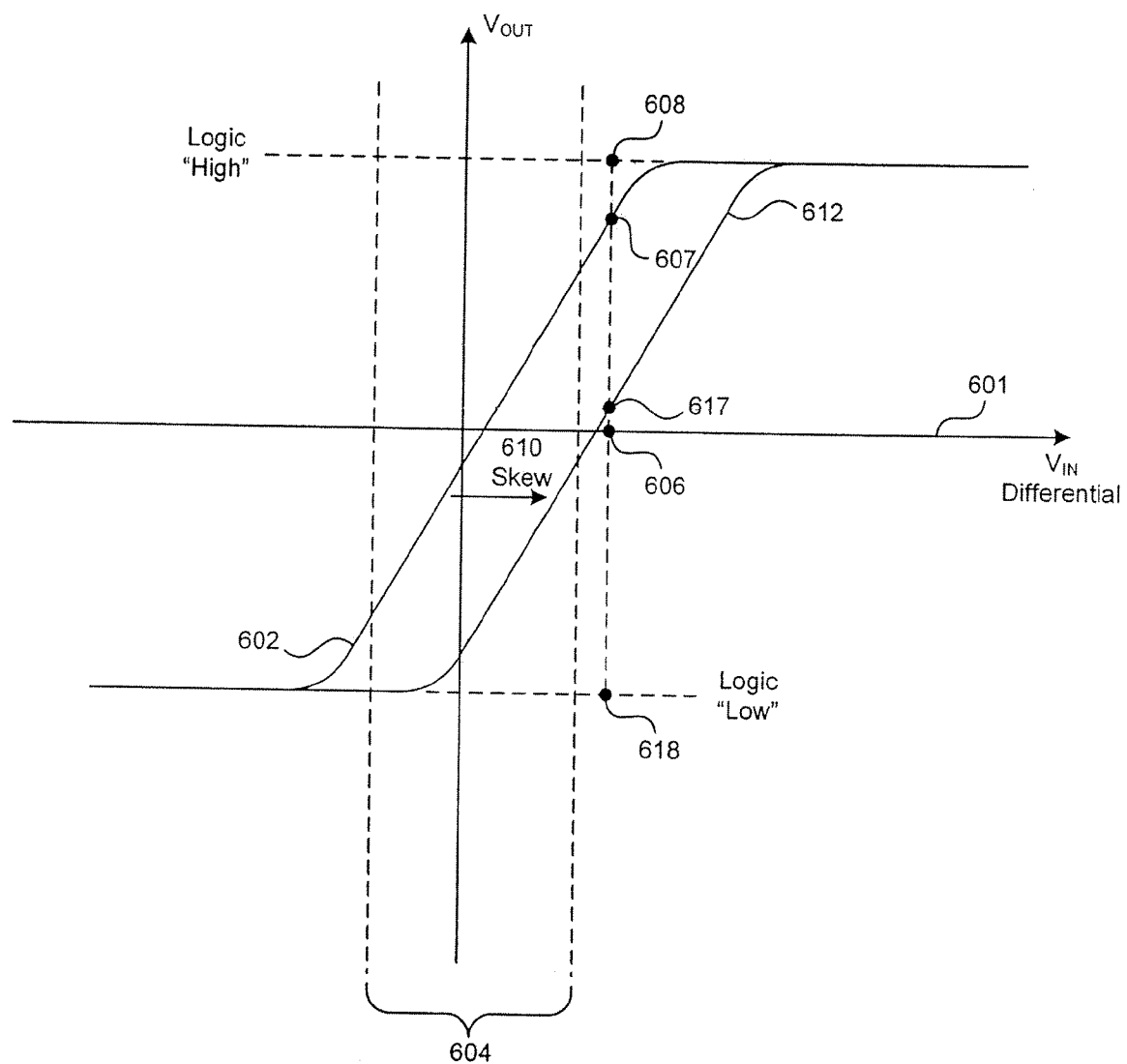
FIG. 6 which shows a transfer characteristic plot of the bidirectional bridge circuit of the embodiment of FIG. 3.

With reference to FIG. 6, the transfer characteristic 602 of a prior art bridge circuit is plotted along with an associated input noise range 604. When the amplitude of a received noise signal is large enough to exceed the noise range 604, for example, an amplitude represented by point 606 on the $v_{in}$ axis, amplification by the bridge circuit (as represented by point 607 on the characteristic curve 602) results in the noise signal being interpreted as a logic "high" signal 608. A logic "high" signal, when provided to receiver circuitry connected to the bridge circuit, is erroneously interpreted as a valid input signal.

Referring now to FIGS. 5 and 6, the differential amplifier with asymmetry 225 includes an additional transistor, transistor 164, that functions to reduce or eliminate the noise introduced through a floating input. Transistor 164 desensitizes the bidirectional bridge circuit 204 to noise by skewing the transfer characteristic curve of the bidirectional bridge circuit 204.

Including transistor 164 in the differential amplifier 225 reduces or eliminates input noise by skewing 610 the bidirectional bridge circuit transfer characteristic curve 612 along the $v_{in}$ axis 601. In an embodiment, the transfer characteristic curve 612 is skewed towards an increasing $v_{in}$ on the $v_{in}$ axis 601, but the transfer characteristic curve 612 can also be skewed towards a decreasing $v_{in}$. Skewing the characteristic curve 612 places the input noise that exceeds the noise range at point 606 at a point 617 on the characteristic curve 612 where it is interpreted as a logic "low" signal 618. The logic "low" signal thus generated by the noise is not recognized or interpreted as a valid input signal by receiver circuitry coupled to the bridge circuit.

A typical prior art technique for desensitizing bidirectional bridge circuits to noise introduced through floating inputs involves the use of hysteresis. Generally speaking, however, hysteresis limits the maximum operating speed of the bidirectional bridge circuit. In contrast, the use of an additional transistor in the differential amplifier 225 to introduce asymmetry does not limit the maximum operating speed of the bridge circuit.

Referring again to FIG. 5, differential amplifier 225 receives signals 212a and 212b from differential amplifiers 126 and 128, respectively. The signals 212a and 212b couple to the gates of transistors 168 and 166, respectively. The drains of transistors 168 and 166 couple to the sources and gates of transistors 160, 162, and 164 and to the input of the NAND gate 170. The output of the NAND gate 170 couples to an inverter 175, and the single-ended output of the inverter is the recovered incoming data signal 212.

The transistor pair formed by transistors 160 and 162 is symmetrical to the transistor pair formed by transistors 166 and 168. Adding transistor 164 in parallel with transistor 162 introduces asymmetry into the pull-up voltage characteristics of the circuit, analogous to a voltage divider. The asymmetry is introduced because transistor 164 increases the pull-up strength of transistor pair 162/164 over that of transistor 160. As a result of this increase in pull-up strength, the node voltage at node bb is higher for a given input at nodes 212a and 212b than it would be in the absence of transistor 164. The higher node voltage skews the transfer characteristic curve in the direction of a higher $v_{in}$. Thus, the transfer characteristic curve is skewed in the direction of a more positive $v_{in}$, as discussed with reference to FIG. 6.

The amount of skew introduced relates to the circuit sensitivity and, thus, the circuit application. The skew should be smaller than the minimum input sensitivity of the circuit, but large enough to desensitize the circuit from input noise. The input sensitivity of the bridge circuit 204 of an embodiment is approximately 100 milli volts. The skew of this bridge circuit 204 is approximately in the range of one-tenth to one-quarter of the input sensitivity, but is not so limited.

While transfer characteristic asymmetry is introduced using the differential amplifier with asymmetry 225, as described above, there are alternative circuit embodiments that introduce transfer characteristic asymmetry at different locations in the bidirectional bridge circuit 204. Two alternative embodiments are now described wherein asymmetry is introduced using the amplifier circuitry 512 and the differential amplifiers 126 and 128, respectively. It is noted that further alternative embodiments can provide asymmetric transfer characteristics using different combinations of these alternative embodiments.

Figure 7:
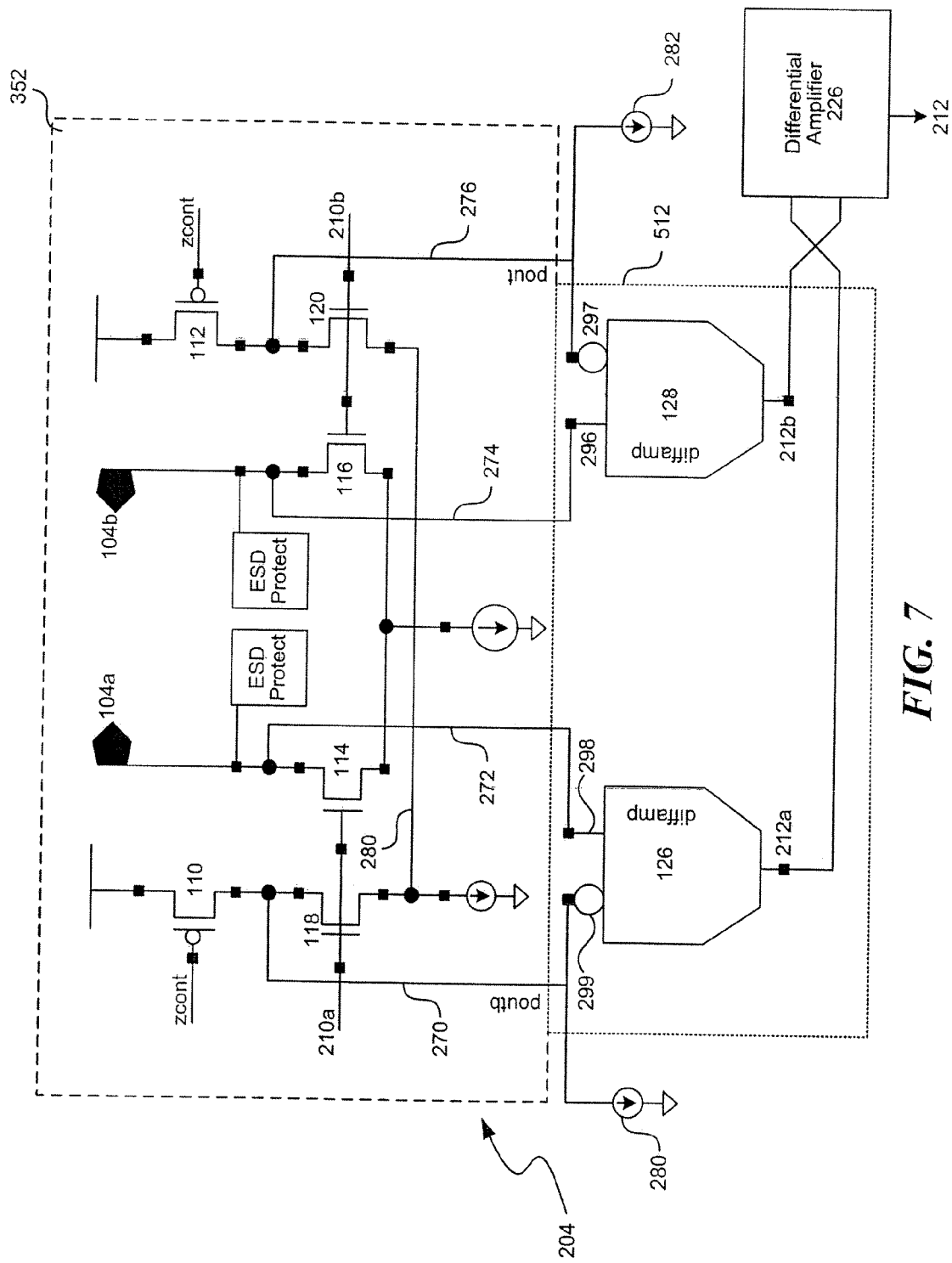
FIG. 7 is a circuit diagram for an alternative embodiment of the bidirectional bridge circuit, under the embodiment of FIG. 1, that introduces transfer characteristic asymmetry via the amplifier circuitry.

FIG. 7 is a circuit diagram for an alternative embodiment of the bidirectional bridge circuit 204, under the embodiment of FIG. 1, that introduces transfer characteristic asymmetry via the amplifier circuitry 512. Instead of skewing the transfer characteristic using additional components in the differential amplifier with asymmetry 225, this alternative embodiment introduces current sources 280 and 282 coupled to the inverting inputs of differential amplifiers 126 and 128 of the amplifier circuitry 512, respectively. The current sources 280 and 282 control the skew of the bidirectional bridge circuit transfer characteristic. As the asymmetry is not introduced in the differential amplifier 225, a typical differential amplifier 226 is used to produce the single-ended logic output 212 from the differential signals 212a and 212b.

Figure 8:
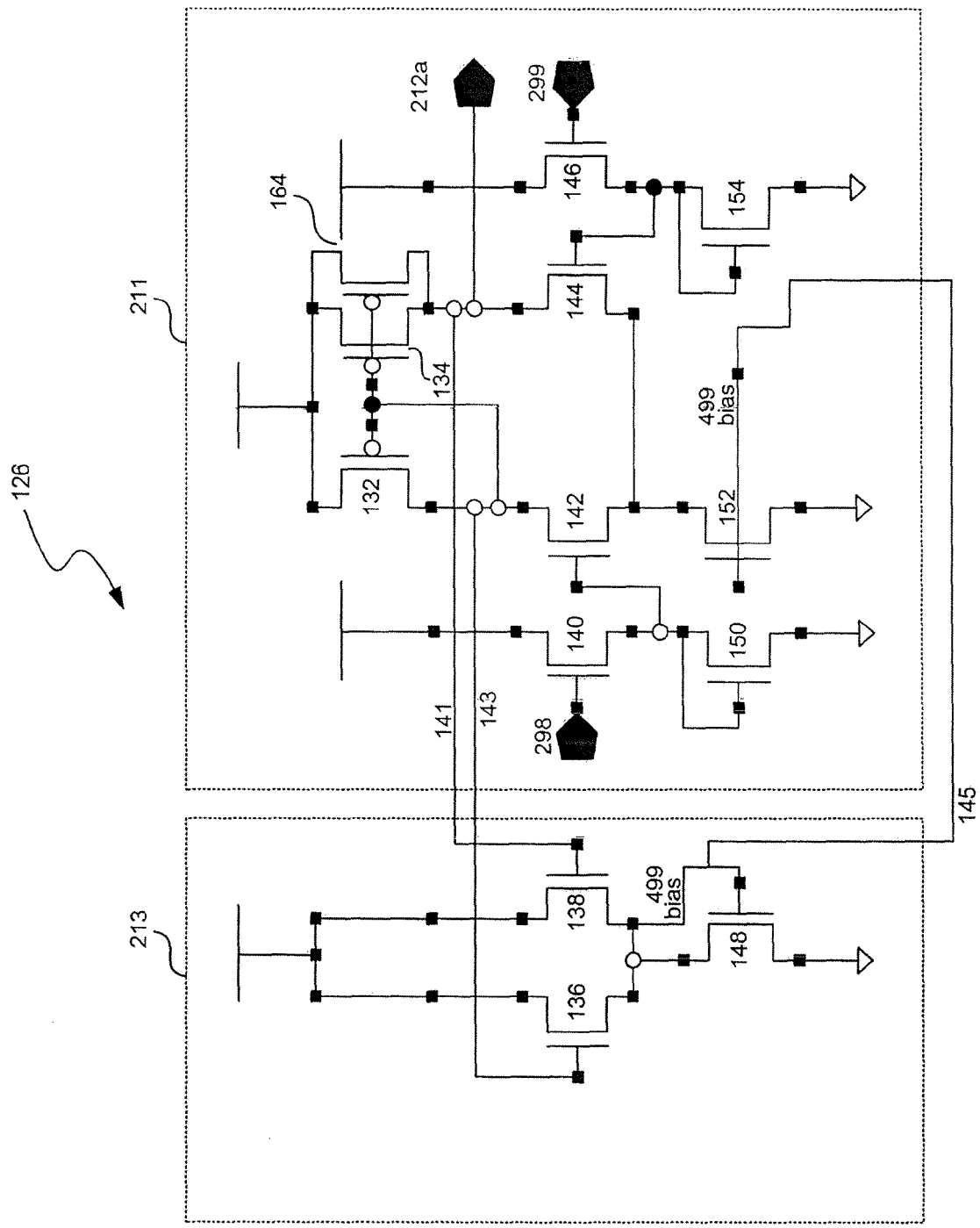
FIG. 8 is a circuit diagram of an alternative embodiment of the differential amplifier, under the embodiment of FIG. 3, that introduces asymmetry in the transfer characteristic by way of the differential amplifiers of the amplifier circuitry.

FIG. 8 is a circuit diagram of an alternative embodiment of the differential amplifier 126, under the embodiment of FIG. 3, that introduces asymmetry in the transfer characteristic by way of the differential amplifiers 126 and 128 of the amplifier circuitry 512. The circuit diagrams of differential amplifiers 126 and 128 are the same, so for clarity the figure shows, and the following discussion describes, only differential amplifier 126 and the associated couplings. However, it is understood that differential amplifier 128 functions in the same manner as differential amplifier 126.

The differential amplifier 126 introduces asymmetry in the transfer characteristic through the use of an additional transistor 164, much like in the differential amplifier with asymmetry 225. Transistor 164 desensitizes the bidirectional bridge circuit 204 to noise by skewing the transfer characteristic as described above with reference to FIG. 5. Adding transistor 164 in parallel with transistor 134 introduces asymmetry into the pull-up voltage characteristics of the circuit, analogous to a voltage divider. The asymmetry is introduced because transistor 164 increases the pull-up strength of transistor pair 134/164 over that of transistor 132 as discussed with reference to FIGS. 5 and 6.

As with the common mode feedback, the asymmetric transfer characteristics described above can also be used in the prior art bidirectional bridge circuit of FIG. 2 to provide high input sensitivity. In an alternative embodiment, the techniques described above for introducing asymmetry can be used with the prior art bidirectional bridge circuit to provide high input sensitivity.

Figure 9:
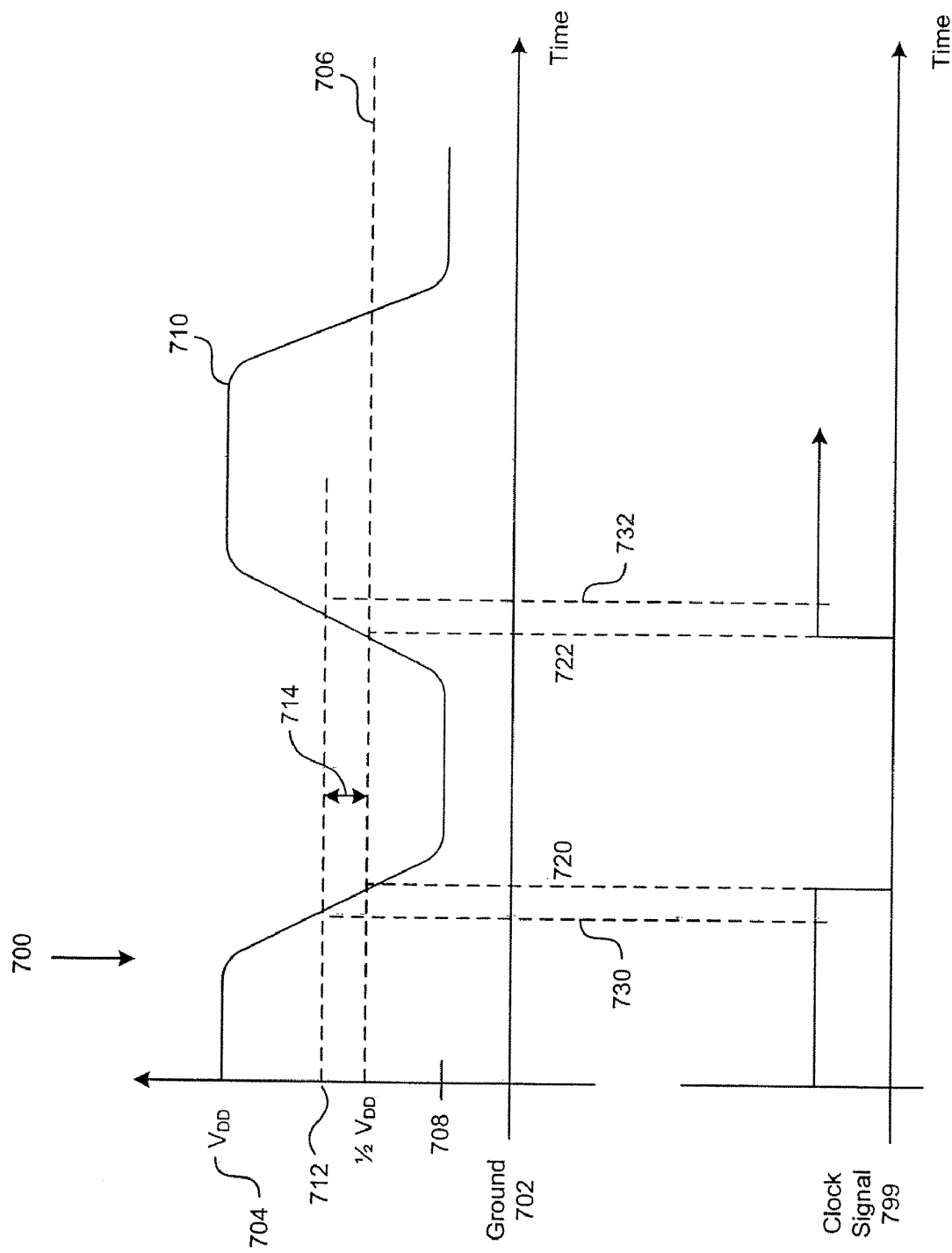
FIG. 9 is a plot of output voltage versus time for a NAND gate of a differential amplifier, under the embodiment of FIG. 5.

Referring again to FIG. 5, the differential amplifier with asymmetry 225 includes a NAND gate 170 that provides the ability to control the power consumption of the bidirectional bridge circuit. While typical NAND gates can be used in the differential amplifier 225, these typical NAND gates may introduce distortions on the output signal 212 as a result of an asymmetric input that is not centered at the logic threshold of the NAND gate. FIG. 9 is a plot 700 of output voltage 710 versus time for NAND gate 170 of differential amplifier 225 under the embodiment of FIG. 5. This output voltage plot 700 illustrates the switching transient problem that arises with prior art NAND gates, as will now be described.

Referring now to FIG. 9, a typical NAND gate expects input voltage levels that change between ground 702 and the value of the positive supply voltage or rail (VDD) 704. Input voltages that vary between ground 702 and the positive supply voltage 704 result in NAND gate logic threshold voltages 706 of one-half the value of the positive supply voltage 704. The position of the NAND gate logic threshold voltage 706 determines the average value of the NAND gate output voltage 720 and 722 relative to the falling edge and the rising edge 722 of the clock signal 799, respectively.

In the differential amplifier 225 of FIG. 5, however, the input voltages vary between the positive supply voltage 704 and the node voltage 708 at node bb, instead of ground 702, because of the asymmetry discussed above. The resulting output is curve 710.

The NAND gate output voltage 710 shows that the input voltage variance between the positive supply 704 and the node voltage 708 at node bb causes an upward shift in the NAND gate logic threshold to level 712. As a result of this logic threshold shift 714, the average values of the NAND gate output 730 and 732 now occur shifted in time relative to the respective edges of the controlling clock signal. As a result of this effect on the NAND gate output values relative to the clocking signal, the NAND gate output signal does not precisely represent the NAND gate input signals. While the NAND gate logic threshold can be adjusted by resizing the components from which the NAND gate is constructed, this component adjustment may introduce additional rise/fall time imbalances that affect the representation of the output signal 212. Therefore, a NAND gate is now described having a logic threshold voltage higher than a mid-supply voltage, thus avoiding the switching time imbalances introduced by component resizing.

Figure 10A:
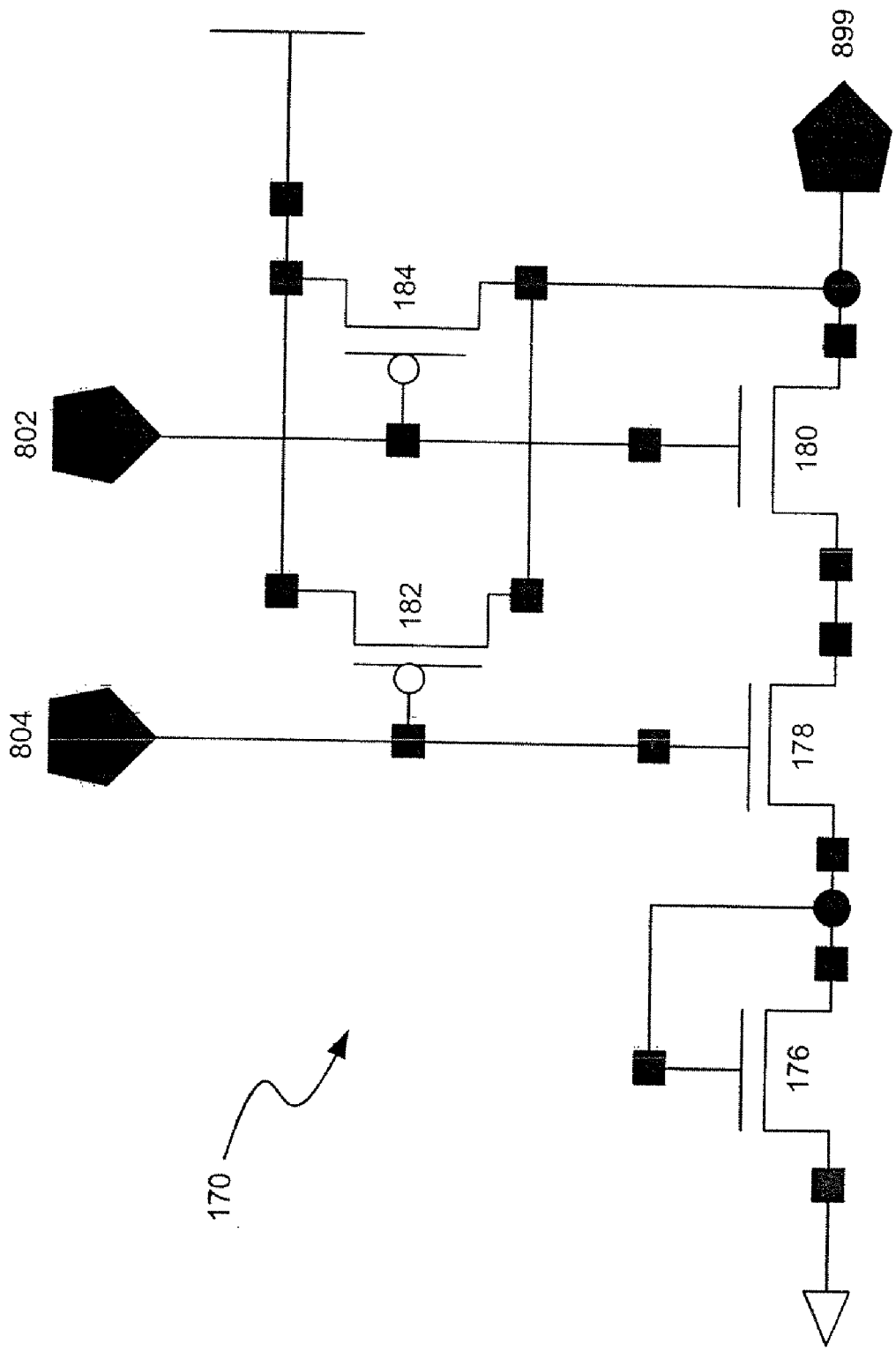
FIG. 10A is a circuit diagram of a NAND gate with a logic threshold voltage higher than a mid-supply voltage, under the embodiment of FIG. 5.

FIG. 10A is a circuit diagram of a NAND gate 170 with a logic threshold voltage higher than a mid-supply voltage, under the embodiment of FIG. 5. This NAND gate 170 presents two inputs, 802 and 804, and an output 899. The input 804 couples to node bb of the differential amplifier 225 of FIG. 5. The NAND gate 170 eliminates the switching transient problems found in the output of prior art NAND gates when used with differential amplifier 225 by placing a diodeconnected n-type metal-oxide-semiconductor field-effect transistor (NMOSFET) 176 at the ground side of the NMOSFET tree formed by transistors 178 and 180. The addition of transistor 176 produces a higher logic threshold voltage without creating asymmetric transient behavior in the output.

Transistor 176 increases the logic threshold of the NAND gate by acting as a voltage divider of the input voltage at input 804. The presence of transistor 176 divides the input voltage present at input 804 approximately equally between the gate and source of transistor 178 and the gate and source of transistor 176. This results in the pull-up strength of transistor 182 being controlled by the voltage difference between the gate and source of both transistors 178 and 176. Thus, a higher input voltage is required at input 804 in order to maintain the same pull-up strength at transistor 182, thereby producing a higher logic threshold.

Just as some bridge circuit configurations benefit from the use of NAND gates having logic threshold voltages higher than a mid-supply voltage, there can be circuit configurations requiring the use of NAND gates having logic threshold voltages lower than the mid-supply voltage. For example, circuit configurations can create circumstances where the logic gate input voltages vary between ground and a positive voltage lower than the positive supply voltage or rail.

Figure 10B:
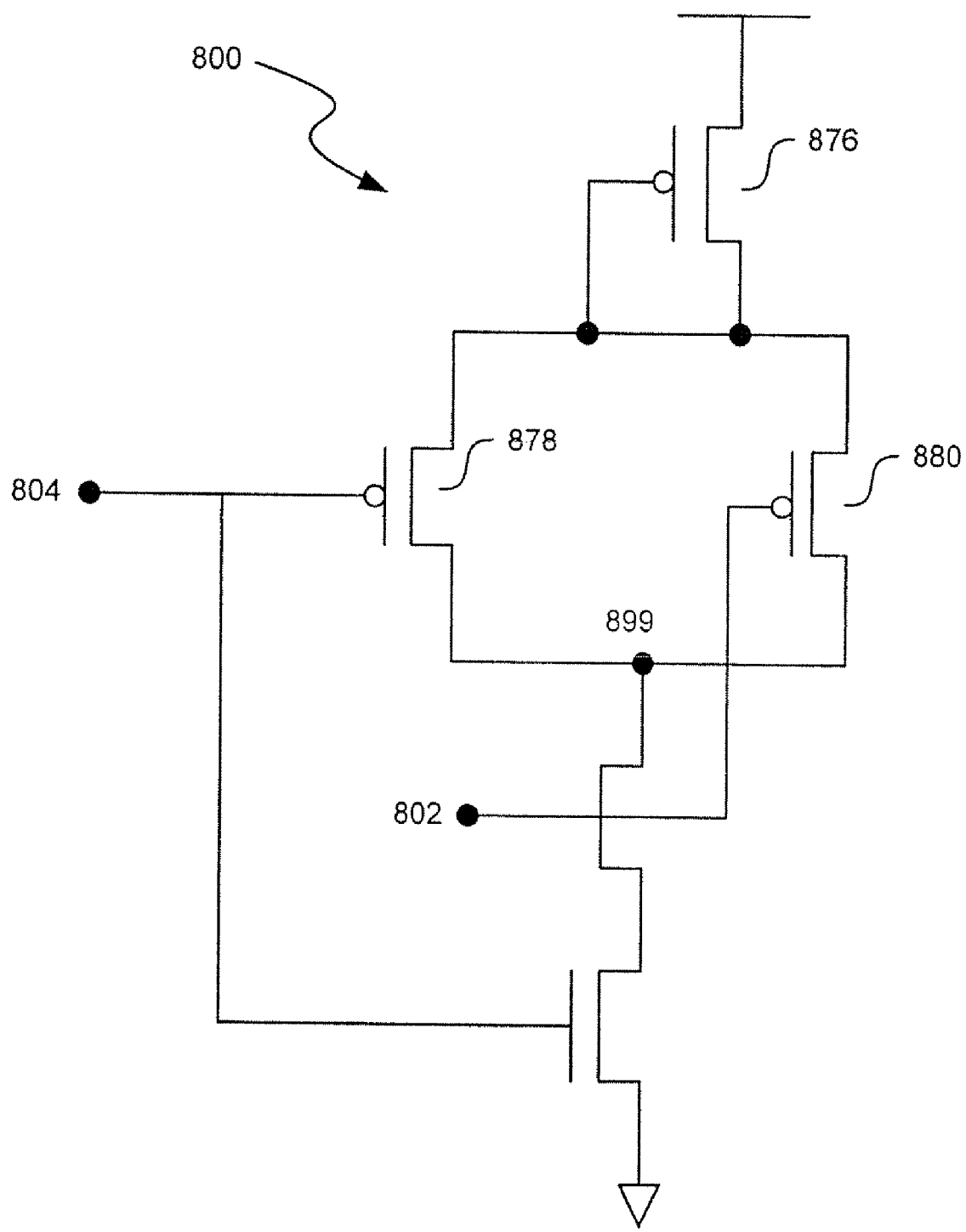
FIG. 10B is a circuit diagram of a NAND gate with a logic threshold voltage lower than a mid-supply voltage, under an alternative embodiment.

FIG. 10B is a circuit diagram of a NAND gate 800 with a logic threshold voltage lower than a mid-supply voltage, under an alternative embodiment. This NAND gate 800 provides two inputs, 802 and 804, and an output 899. The NAND gate 800 eliminates the switching transient problems found in the output of prior art NAND gates of differential amplifier 225 by placing a diode-connected p-type metal-oxide-semiconductor field-effect transistor (PMOSFET) 876 at the supply voltage or rail side of the PMOSFET tree formed by transistors 878 and 880. The addition of transistor 876 produces a lower logic threshold voltage without creating asymmetric transient behavior in the output.

Figure 11A:
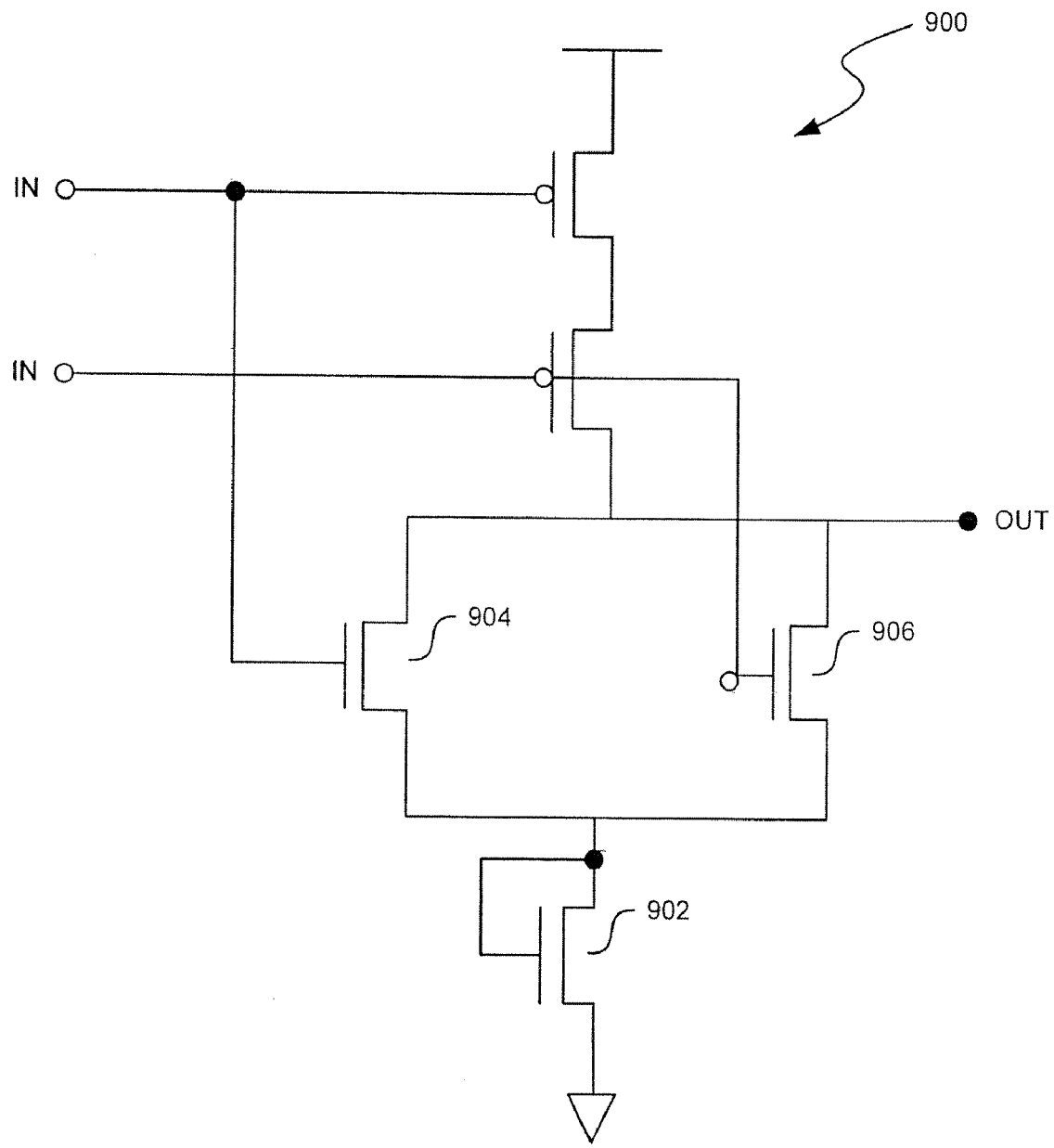
FIG. 11A is a circuit diagram of a NOR gate with a logic threshold voltage higher than a mid-supply voltage, under one embodiment.

While the circuit configurations discussed above benefit from the use of NAND gates having logic threshold voltages higher and lower than a mid-supply voltage, some circuit configurations might benefit from NOR gates having logic threshold voltages that differ from the mid-supply voltage. FIG. 11A is a circuit diagram of a NOR gate 900 with a logic threshold voltage higher than a mid-supply voltage, under one embodiment. This NOR gate 900 provides two inputs IN and an output OUT. The NOR gate 900 eliminates switching transient problems by placing a diode-connected NMOSFET 902 at the ground side of the NMOSFET tree formed by transistors 904 and 906. The addition of transistor 902 produces a higher logic threshold voltage without creating asymmetric transient behavior in the output.

Figure 11B:
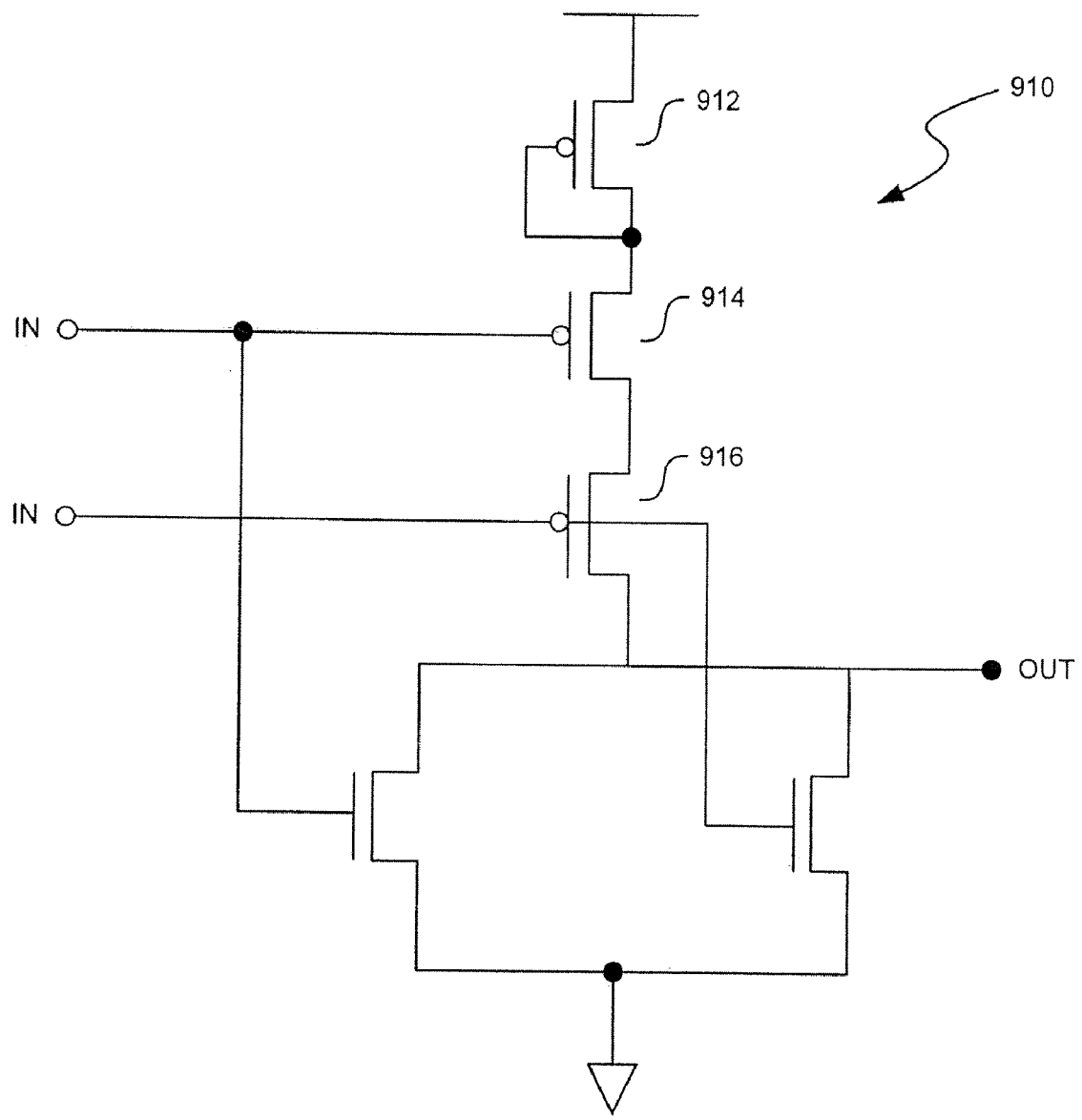
FIG. 11B is a circuit diagram of a NOR gate that has a logic threshold voltage lower than a mid-supply voltage, under an alternative embodiment to that of FIG. 11A.

Similarly, FIG. 11B is a circuit diagram of a NOR gate 910 with a logic threshold voltage lower than a mid-supply voltage, under an alternative embodiment. This NOR gate 910 provides two inputs IN and an output OUT. The NOR gate 910 eliminates switching transient problems by placing a diode-connected PMOSFET 912 at the supply rail side of the PMOSFET tree formed by transistors 914 and 916. The addition of transistor 912 produces a lower logic threshold voltage without creating asymmetric transient behavior in the output.

The techniques to adjust the logic threshold voltage in logic gates described above does not need to be restricted to NAND or NOR gates, but can be applied to any other combinatorial logic gate, for example, XOR gates, or composite gates having logic levels larger than 1. Further, as with the common mode feedback and asymmetric transfer characteristic, the switching transient control described above can also be used in the prior art bidirectional bridge circuit of FIG. 2 to prevent asymmetric transient behavior. In an alternative embodiment, the techniques described above for controlling switching transients can be applied in the prior art bidirectional bridge circuit.

Figure 12:
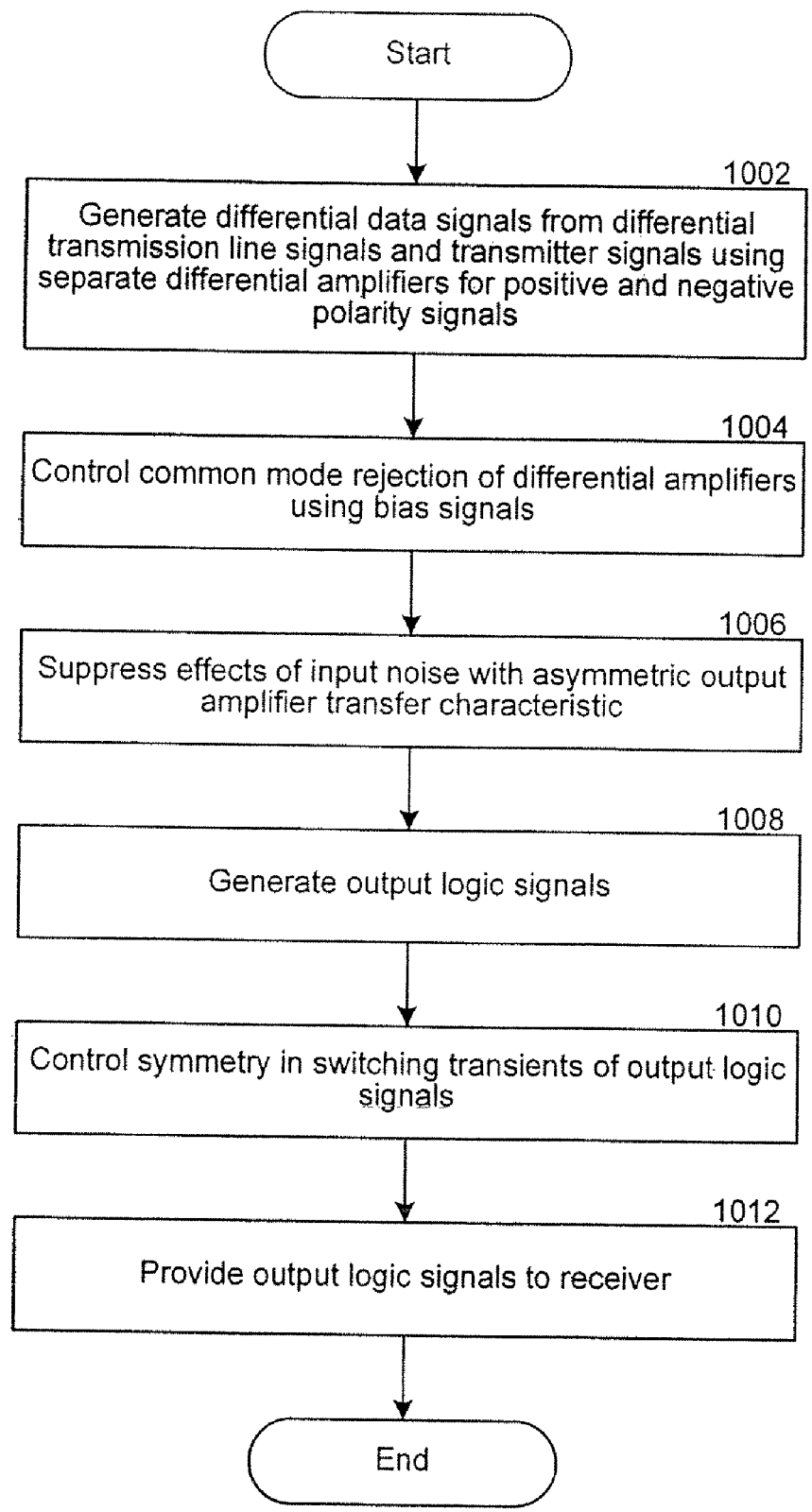
FIG. 12 is a flow diagram for a method for providing a bidirectional communications interface, under the embodiment of FIG. 1.

FIG. 12 is a flow diagram for a method for providing a bidirectional communications interface, under the embodiment of FIG. 1. As described above, the interface includes a bidirectional bridge circuit connecting a transmitter and a receiver to a transmission line. The bridge circuit generates, at step 1002, positive and negative polarity data signals using separate differential amplifiers that receive differential signal pairs from each side of a differential link to the transmission line and the transmitter. Common mode feedback circuitry of the bridge circuit independently controls common mode rejection in each of the separate differential amplifiers, at step 1004, using bias signals generated in response to an output common mode feedback voltage from each of the differential amplifiers. The bridge circuit uses an output amplifier with an asymmetric transfer characteristic to suppress the effects of input noise on the output logic signals, at step 1006. The bridge circuit generates output logic signals representing data received on the transmission line from the positive polarity data signals and the negative polarity data signals, at step 1008. An increased logic threshold voltage of a logic gate of the output amplifier controls symmetry in the switching transients of the output logic signals, at step 1010. The bridge circuit provides the output logic signals to the receiver, at step 1012.

Aspects of the invention may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the invention include: microcontrollers with memory (such as electronically erasable programmable read only memory (EEPROM)), embedded microprocessors, firmware, software, etc. If aspects of the invention are embodied as software at least one stage during manufacturing (e.g. before being embedded in firmware or in a PLD), the software may be carried by any computer readable medium, such as magnetically- or optically-readable disks (fixed or floppy), modulated on a carrier signal or otherwise transmitted, etc. Furthermore, aspects of the invention may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "above," "below," and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform routines having steps in a different order. The teachings of the invention provided herein can be applied to other systems, not necessarily the system described herein. These and other changes can be made to the invention in light of the detailed description. The elements and acts of the various embodiments described above can be combined to provide further embodiments.

All of the above references and U.S. patents and applications are incorporated herein by reference. Aspects of the invention can be modified, if necessary, to employ the systems, functions and concepts of the various patents and applications described above to provide yet further embodiments of the invention.

Incorporated by reference herein are all above references, patents, or applications and the following U.S. applications, which are assigned to the assignee of this application: application Ser. No. 10/371,220, filed Feb. 19, 2003, entitled DATA SYNCHRONIZATION ACROSS AN ASYNCHRONOUS BOUNDARY USING, FOR EXAMPLE, MULTI-PHASE CLOCKS, U.S. Pat. No. 7,231,009, issued Jun. 12, 2007; application Ser. No. 09/989,590, filed Nov. 20, 2001, entitled HIGH-SPEED BUS WITH EMBEDDED CLOCK SIGNALS, U.S. Pat. No. 6,845,461, issued Jan. 18, 2005; application Ser. No. 09/989,580, filed Nov. 20, 2001, entitled BI-DIRECTIONAL BRIDGE CIRCUIT HAVING HIGH COMMON MODE REJECTION AND HIGH INPUT SENSITIVITY, U.S. Pat. No. 7,103,013, issued Sep. 5, 2006; application Ser. No. 09/989,587, Nov. 20, 2001, entitled MULTI-PHASE VOLTAGE CONTROL OSCILLATOR ("VCO") WITH COMMON MODE CONTROL, U.S. Pat. No. 6,717,478, issued Apr. 6, 2004; application Ser. No. 09/989,645, filed Nov. 20, 2001, entitled SYSTEM AND METHOD FOR MULTIPLE-PHASE CLOCK GENERATION, U.S. Pat. No. 6,809,567, issued Oct. 26, 2004; application Ser. No. 10/043,886, filed Oct. 26, 2001, entitled CLOCK AND DATA RECOVERY METHOD AND APPARATUS, U.S. Pat. No. 6,693,985, issued Feb. 17, 2004; and application Ser. No. 09/989,647, filed Nov. 20, 2001, entitled LOGIC GATES INCLUDING DIODE-CONNECTED METALOXIDE-SEMICONDUCTOR FIELD-EFFECT TRANSISTORS (MOSFETS) TO CONTROL INPUT THRESHOLD VOLTAGE LEVELS AND SWITCHING TRANSIENTS OF OUTPUT LOGIC SIGNALS, U.S. Pat. No. 7,058,121, issued Jun. 6, 2006. Aspects of the invention can be modified, if necessary, to employ the systems, functions and concepts of the various patents and applications described above to provide yet further embodiments of the invention.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

What we claim is:

1. A transceiver comprising: a transmitter;
a receiver;
the transmitter and receiver adapted for coupling with an external transmission line; and
a buffer adapted for coupling to the external transmission line and comprising:
an input amplifier section that generates differential data signal pairs from a difference between differential transmission line signals and differential transmitter signals; and
an output differential amplifier section that generates output logic signals from the differential data signal pairs, the output logic signals representing data received on the transmission line; and
input noise at the input amplifier section is suppressed using an asymmetric transfer characteristic that offsets output signal logic levels with regard to the input noise.

2. A transceiver as in claim 1, wherein:
the transmitter includes:
(1) a buffer adapted for coupling to a an external transmission line, the buffer comprising:
(a) an input amplifier section that generates differential data signal pairs from a difference between differential transmission line signals and differential transmitter signals; and
(b) an output differential amplifier section that generates output logic signals from the differential data signal pairs, the output logic signals representing data received on the transmission line; and
(2) input noise at the input amplifier section is suppressed using an asymmetric transfer characteristic that offsets output signal logic levels with regard to the input noise; and
the receiver includes:
(3) a buffer adapted for coupling to an external transmission line, the buffer comprising:
(a) an input amplifier section that generates differential data signal pairs from a difference between differential transmission line signals and differential transmitter signals; and
(b) an output differential amplifier section that generates output logic signals from the differential data signal pairs, the output logic signals representing data received on the transmission line; and
(4) input noise at the input amplifier section is suppressed using an asymmetric transfer characteristic that offsets output signal logic levels with regard to the input noise.

3. A transmitter comprising:
a buffer adapted for coupling to a an external transmission line, the buffer comprising:
an input amplifier section that generates differential data signal pairs from a difference between differential transmission line signals and differential transmitter signals; and
an output differential amplifier section that generates output logic signals from the differential data signal pairs, the output logic signals representing data received on the transmission line; and
input noise at the input amplifier section is suppressed using an asymmetric transfer characteristic that offsets output signal logic levels with regard to the input noise.

4. The transmitter of claim 3, wherein:
the asymmetric transfer characteristic is skewed using an asymmetrical transistor configuration at an output side of a differential pair that forms the output differential amplifier section; and
input noise introduced by a floating input is suppressed.

5. The transmitter of claim 3, wherein:
a first differential amplifier of the input amplifier section generates positive polarity data signals from a difference between a positive polarity transmission line signal and a positive polarity transmitter signal;

a second differential amplifier of the input amplifier section generates negative polarity data signals from a difference between a negative polarity transmission line signal and a negative polarity transmitter signal; and
common mode rejection is independently controlled in each of the first and second differential amplifiers using bias signals generated in response to an output common mode feedback voltage from the first and second differential amplifiers.

6. A receiver comprising:
a buffer adapted for coupling to an external transmission line, the buffer comprising:
an input amplifier section that generates differential data signal pairs from a difference between differential transmission line signals and differential transmitter signals; and
an output differential amplifier section that generates output logic signals from the differential data signal pairs, the output logic signals representing data received on the transmission line; and
input noise at the input amplifier section is suppressed using an asymmetric transfer characteristic that offsets output signal logic levels with regard to the input noise.

7. The receiver of claim 6, wherein the asymmetric transfer characteristic is skewed using an asymmetrical transistor configuration at an output side of a differential pair that forms the output differential amplifier section, wherein the input noise introduced by a floating input is suppressed.

8. The receiver of claim 6, wherein a first differential amplifier of the input amplifier section generates positive polarity data signals from a difference between a positive polarity transmission line signal and a positive polarity transmitter signal, wherein a second differential amplifier of the input amplifier section generates negative polarity data signals from a difference between a negative polarity transmission line signal and a negative polarity transmitter signal, wherein common mode rejection is independently controlled in each of the first and second differential amplifiers using bias signals generated in response to an output common mode feedback voltage from the first and second differential amplifiers.

9. A receiver as in claim 6, further comprising:
means for receiving differential data signals of opposite polarity from a transmission line at a differential amplifier;
means for skewing an output transfer characteristic of the differential amplifier, the asymmetric transfer characteristic offsets output signal logic levels with regard to input noise signal levels; and
means for generating output logic signals representative of data received via the transmission line using the asymmetric transfer characteristic.

10. The receiver of claim 9, wherein the differential data signals of opposite polarity from the: transmission line are generated by an external transmitter.

11. The receiver of claim 10, further including the external transmitter.

12. A receiver as in claim 6, further comprising means for interfacing the receiver to a transmission line, the means for interfacing the receiver to the transmission line including:
means for generating a positive polarity difference signal and a negative polarity difference signal from differential signals of the transmission line and the receiver;
means for generating a positive polarity data signal by differentially amplifying the positive polarity difference signal;
means for generating a negative polarity data signal by differentially amplifying the negative polarity difference signal; and
means for differentially amplifying the positive polarity data signal and the negative polarity data signal to generate an output logic signal representative of data received via the transmission line, so that the differential amplification of the positive polarity data signal and the negative polarity data signal suppresses input noise using an asymmetric transfer characteristic that offsets output signal logic levels with regard to input noise.

13. A receiver as in claim 6, wherein:
the input amplifier section includes input amplifier circuitry coupled to receive transmission line differential signals and, differential signals from an external transmitter and generate data signals of opposite polarities by subtracting the transmitter differential signals from the transmission line differential signals of corresponding polarity;
the output differential amplifier section includes output circuitry that amplifies and combines the generated data signals to provide single-ended logic signals representative of data received on the transmission line; and
the output circuitry suppresses input noise using an asymmetric transfer characteristic that offsets output signal logic levels with regard to input noise.

14. A receiver as in claim 6, further comprising a communications interface including:
means for generating positive and negative polarity data signals using differential amplifiers that receive differential signal pairs from a differential link to a transmission line;
means for generating output logic signals representing data received on the transmission line using the positive polarity data signals and the negative polarity data signals; and
means for suppressing effects of input noise on the output logic signals by skewing an output amplifier transfer characteristic.

15. A receiver as in claim 14, wherein the differential signal pairs are generated by an external transmitter.

16. A receiver as in claim 14, further comprising: means for independently controlling common mode rejection in each of the separate differential amplifiers using bias signals generated in response to an output common mode feedback voltage from each of the differential amplifiers.

17. A receiver as in claim 14, further comprising: means for independently controlling common mode rejection in each of the separate differential amplifiers, wherein the means for controlling common mode rejection comprises:
means for receiving a common mode output voltage from a differential amplifier;
means for generating a common mode feedback voltage using the common mode output voltage; and
means for suppressing a common mode gain of the differential amplifier in response to the common mode feedback voltage, wherein the common mode rejection of the differential amplifier is increased.

18. A receiver as in claim 14, further comprising: means for controlling symmetry in switching transients of the output logic signals by increasing a logic threshold voltage of a logic gate of the output amplifier above a mid-supply voltage of the logic gate.

* * * * *